US010432179B1

(12) United States Patent
Lee et al.

(10) Patent No.: US 10,432,179 B1
(45) Date of Patent: Oct. 1, 2019

(54) METHODS, APPARATUS, AND SYSTEM FOR FREQUENCY DOUBLER USING A PASSIVE MIXER FOR MILLIMETER WAVE DEVICES

(71) Applicant: GLOBALFOUNDRIES INC., Grand Cayman (KY)

(72) Inventors: See Taur Lee, Allen, TX (US); Abdellatif Bellaouar, Richardson, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/928,910

(22) Filed: Mar. 22, 2018

(51) Int. Cl.
| | |
|---|---|
| H03K 5/00 | (2006.01) |
| H03K 17/687 | (2006.01) |
| H03D 7/14 | (2006.01) |
| H03K 19/21 | (2006.01) |
| H01L 27/12 | (2006.01) |
| G01S 7/03 | (2006.01) |
| H01L 23/66 | (2006.01) |
| H01L 21/84 | (2006.01) |
| G01S 13/93 | (2006.01) |
| G01S 7/35 | (2006.01) |
| H01L 29/78 | (2006.01) |

(52) U.S. Cl.
CPC ....... H03K 5/00006 (2013.01); H03D 7/1466 (2013.01); H03K 17/687 (2013.01); *G01S 7/03* (2013.01); *G01S 7/35* (2013.01); *G01S 13/93* (2013.01); *H01L 21/84* (2013.01); *H01L 23/66* (2013.01); *H01L 27/1203* (2013.01); *H01L 29/7838* (2013.01); *H01L 2223/6688* (2013.01); *H03K 19/21* (2013.01)

(58) Field of Classification Search
CPC .... H03K 5/00006; H03B 19/00; H03B 19/06; H03B 19/10; H03B 19/14
USPC ........................................................ 327/122
See application file for complete search history.

(56) References Cited

U.S. PATENT DOCUMENTS

| | | | |
|---|---|---|---|
| 6,664,824 B2 | 12/2003 | Laws | |
| 9,397,644 B2* | 7/2016 | Kim | ..................... H03K 19/215 |
| 2008/0068052 A1 | 3/2008 | Tsai et al. | |
| 2014/0145773 A1* | 5/2014 | Hashimoto | ............ H03K 3/012 327/218 |

* cited by examiner

*Primary Examiner* — John W Poos
(74) *Attorney, Agent, or Firm* — Williams Morgan, P.C.

(57) ABSTRACT

We disclose frequency doublers for use in millimeter-wave devices. One such frequency doubler comprises at least one passive mixer comprising at least one of the following: at least one transistor configured to receive a back gate voltage; at least one first input driver circuit; and two second input driver circuits. We also disclose a method comprising determining a target output voltage of a frequency doubler comprising at least one passive mixer comprising at least one transistor configured to receive a back gate voltage; determining an output voltage of the frequency doubler; increasing a back gate voltage of the at least one transistor, in response to determining that the output voltage is below the target output voltage; and decreasing the back gate voltage of the at least one transistor, in response to determining that the output voltage is above the target output voltage.

20 Claims, 12 Drawing Sheets

METHODS, APPARATUS, AND SYSTEM FOR FREQUENCY DOUBLER USING A PASSIVE MIXER FOR MILLIMETER WAVE DEVICES

BACKGROUND OF THE INVENTION

Field of the Invention

Generally, the present disclosure relates to sophisticated semiconductor devices, and, more specifically, to frequency doublers for millimeter wave devices.

Description of the Related Art

There have been many advances in devices that use millimeter wave (mm-wave) signals. Semiconductor devices that involve mm-wave applications include devices that operate based on the electromagnetic spectrum of radio band frequencies in the range of about 30 Gigahertz (GHz) to about 300 GHz. The mm-wave radio waves have a wavelength in the range of 1 millimeter (mm) to about 10 mm, which corresponds to a radio frequency of 30 GHz to about 300 GHz. This band of frequencies is sometimes referred to as extremely high frequency (EHF) frequency band range. Examples of applications of mm-wave applications include radar devices, high-speed communication devices (e.g., wireless gigabit (WiGig) devices,), etc. Radar devices have been implemented in various applications such as vehicle safety and automation applications.

Implementing mm-wave applications produces many challenges when designing circuits for these applications. Special consideration is to be given to designing frequency doublers. In many mm-wave devices, a signal may be generated at a first frequency, but be desired to provide a product signal having a frequency 2×, 4×, 8×, etc. the first frequency. One or more frequency doublers may provide such a product signal In light of the ongoing race to reduce device sizes and/or power consumptions, known frequency doublers, which comprise transformers and inductors, have undesirably large size for use in contemporary devices. Also, known frequency doublers may have pulling issues and generate undesirable output phase noise. Pulling issues may be pronounced in system-on-chip (SOC) designs. These problems are particularly pronounced for millimeter wave devices, such as vehicular radar devices, 5G telecommunication devices, and the like.

It would be desirable to have a frequency doubler that may allow one or more of reduced size, reduced power consumption, or reduced output phase noise.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment, the present disclosure is directed to a frequency doubler, comprising at least one passive mixer comprising at least one of the following: at least one transistor configured to receive a back gate voltage (such as four transistors so configured); at least one first input driver circuit comprising an AC coupled capacitor, a first inverter, a feedback resistor, and a second inverter (such as two first input drivers); and two second input driver circuits each comprising an AC coupled capacitor, a first inverter, a first feedback resistor, a second inverter, and a DC bias resistor, wherein the DC bias resistors of both second input driver circuits receive a common mode voltage.

In one embodiment, the present disclosure is directed to a method, comprising determining a target output voltage of a frequency doubler comprising at least one passive mixer comprising at least one transistor configured to receive a back gate voltage; determining an output voltage of the frequency doubler; increasing a back gate voltage of the at least one transistor, in response to determining that the output voltage is below the target output voltage; and decreasing the back gate voltage of the at least one transistor, in response to determining that the output voltage is above the target output voltage.

In one embodiment, the present disclosure is directed to a manufacturing system, configured to manufacture a frequency doubler, such as is described above.

Embodiments herein may provide frequency doublers with one or more of reduced size, reduced power consumption, or reduced output phase noise.

BRIEF DESCRIPTION OF THE DRAWINGS

The disclosure may be understood by reference to the following description taken in conjunction with the accompanying drawings, in which like reference numerals identify like elements, and in which.

Figure 1:
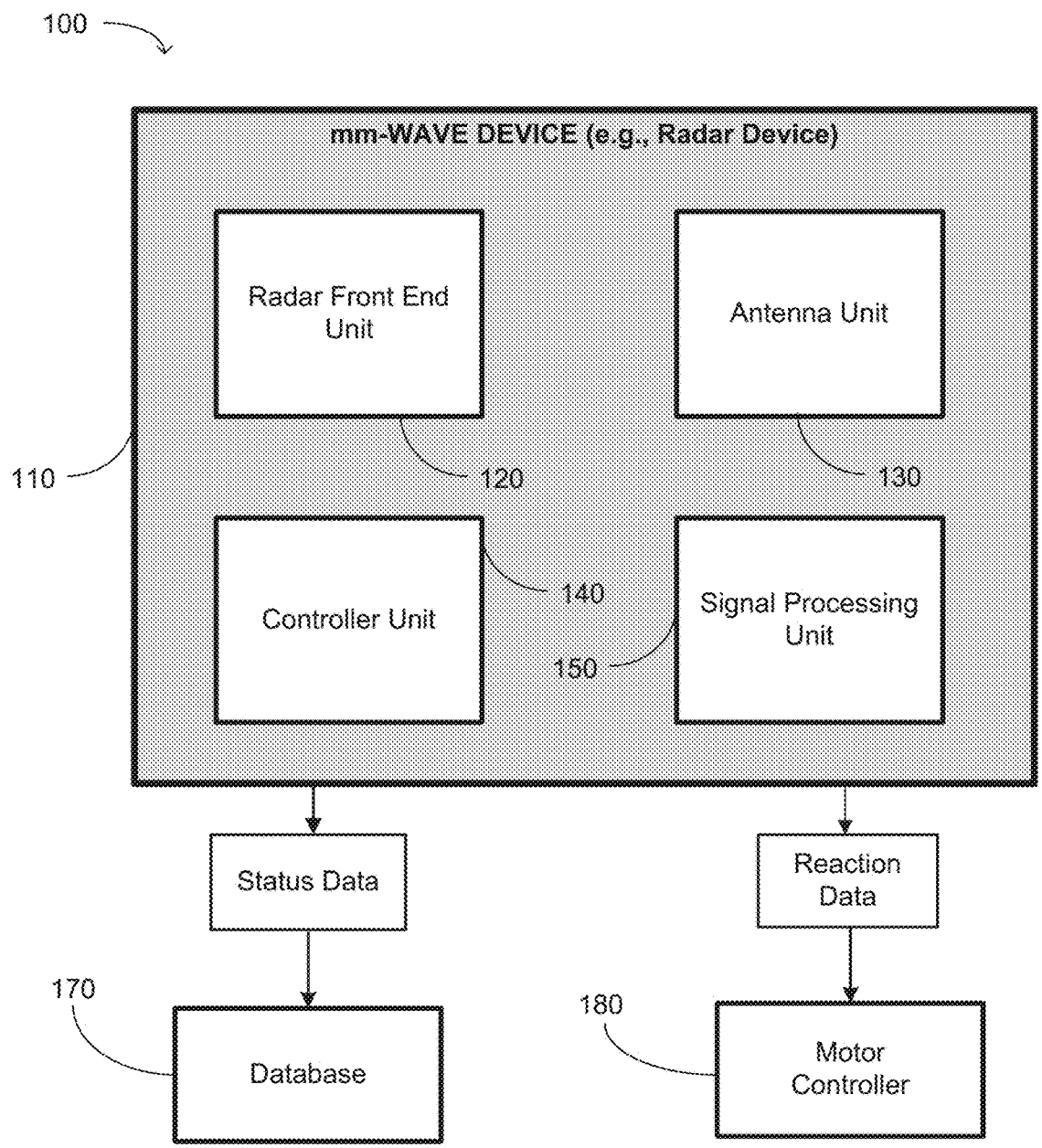
FIG. 1 illustrates a stylized block diagram representation of a radar system, in accordance with embodiments herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims. Moreover, the stylized depictions illustrated in the drawings are not drawn to any absolute scale.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems, and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for millimeter wave (mm-wave) frequency doublers with one or more of lower size and/or reduced output phase noise. Embodiments herein call for utilizing back gate biasing of one or more transistors to improve performance of passive mixers in mm-wave frequency doublers. Embodiments herein call for using back gate biasing for tuning the on resistance ($R_{ON}$) of the transistors of the passive mixer, and subsequently the output voltage of the frequency doubler. The back gate biasing of embodiments herein may be implemented into semiconductor devices of varying technology that allows for back gate biasing of transistors, e.g., fully depleted silicon-on-insulator (FD SOI) devices.

For ease of illustration, embodiments herein is depicted within the context of a radar device, however, those skilled in the art would readily appreciate that the concepts disclosed herein may be implemented in other types of devices, such as high-speed communication devices, network devices, high-definition video devices, etc. Turning now to FIG. 1, a stylized block diagram representation of an mm-wave system, in accordance with embodiments herein, is illustrated.

A system 100 may comprise an mm-wave device 110, a database 170, and a motor controller 180. The mm-wave device 110 may be a radar device, a wireless communication device, a data network device, a video device, or the like. For illustrative purposes and for the sake of clarity and ease of description, the mm-wave device 110 is described in the context of a radar application; as such, the mm-wave device 110 may also be referred to below as a radar device 110. However, those skilled in the art having benefit of the present disclosure would appreciate that the concepts described herein may be applied to a variety of type of mm-wave applications, including vehicle applications using radar signals, wireless network applications, data network applications, video and audio applications, etc.

The radar device 110 is capable of transmitting a radar signal, receiving a reflected signal resultant from the reflection of the radar signal, processing the reflected signal, and providing status data and/or reaction data for performing one or more actions based on the reflected signal. In one embodiment, the status data may include status of the target from which the reflection was received. Further, a motor controller 180 may control operations of one or more motors. Examples of motors may include devices that performing braking functions, steering functions, gear-shifting functions, accelerating functions, warning functions, and/or other actions relating to the operations of a road vehicle, an aircraft, and/or a watercraft. The motor controller 180 may use the reaction data and/or the status data to perform these control functions. The motor controller 180 may comprise one or more controllers that are capable of controlling a plurality of devices that perform the various operations of a road vehicle, an aircraft, and/or a watercraft.

The radar device 110 may comprise a radar front end unit 120, an antenna unit 130, a controller unit 140, and a signal processing unit 150. The radar front end unit 120 may comprise a plurality of components, circuit, and/or modules, and is capable of sending, receiving, processing, and reacting to radar signals. In one embodiment, the radar device 110 may be encompassed into a single integrated circuit (IC) chip. In some embodiments, the radar device 110 may be formed on a plurality of integrated circuits that are positioned on a single IC chip. In other embodiments, radar device 110 may be formed on single integrated circuit, which is shrouded into an IC chip.

The radar front end unit 120 is capable of providing a radar signal. In one embodiment, the frequency range of the radar signals processed by the radar device 110 may be in the range of about 10 GHz to about 90 GHz. The radar front end unit 120 is capable of generating a radar signal at a predetermined frequency range and directing the radar signal at a predetermined target area. The radar front end unit 120 is also capable of receiving a reflected signal based on the reflection of radar signal, and processing the reflected signal to determine a plurality of characteristics, such as the direction of a target, the speed of a target, the relative distance of a target, and/or the like. A more detailed description of the radar front end unit 120 is provided in FIG. 3 and accompanying description below.

In an alternative embodiment, the 120 may be a network communications front end unit, instead of a radar front end unit. In this embodiment, instead of receiving, transmitting, and/or processing radar signals, the device 110 may process network communications for various types of communication applications, such as packet data network communications, wireless (e.g., cellular communications, IEEE 802.11ad WiGig Technology, etc.), data communications, etc. The concepts disclosed herein in the context of radar applications may also be utilized for other types of applications, such as network communications, wireless communications, high-definition video, etc.

Continuing referring to FIG. 1, the antenna unit 130 may also comprise a transmission antenna and/or a receiver antenna. Further, each of the transmission and receiver antennas may comprise sub-portions to form an array of antennas. The transmission antennas are used for transmitting the radar signal, while the receiver antennas are used for receiving reflected signals resulting from reflections of the radar signal. A more detailed description of the antenna unit 130 is provided in FIG. 7, and accompanying description below.

Continuing referring to FIG. 1, the radar device 110 may also comprise a signal processing unit 150. The signal processing unit is capable of performing various analog and/or digital processing of the signals that are transmitted and/or received by the radar device 110. For example, the radar signal sent transmitted by the radar device may be amplified prior to its transmission. Further, the reflected signal received by the radar device 110 may be sent through one or more analog filter stages. The reflected signals may then be converted to a digital signal by one or more analog-to-digital converters (ADC) in the signal processing unit 150. Digital signal processing (DSP) may be performed on the digitized signal. A more detailed description of the signal processing unit 150 is provided in FIG. 6 and accompanying description below.

Continuing referring to FIG. 1, the radar device 100 may also comprise a controller unit 140. The controller unit 140 may perform various control operations of the radar device 110. These functions include generating a radar signal, transmitting the radar signal, receiving a reflected signal, processing the reflected signal, and perform one or more determinations of the location, direction, speed, etc. of a target based on the reflected signal. The controller unit 140 is capable of generating the status data and the reaction data described above.

Figure 2:
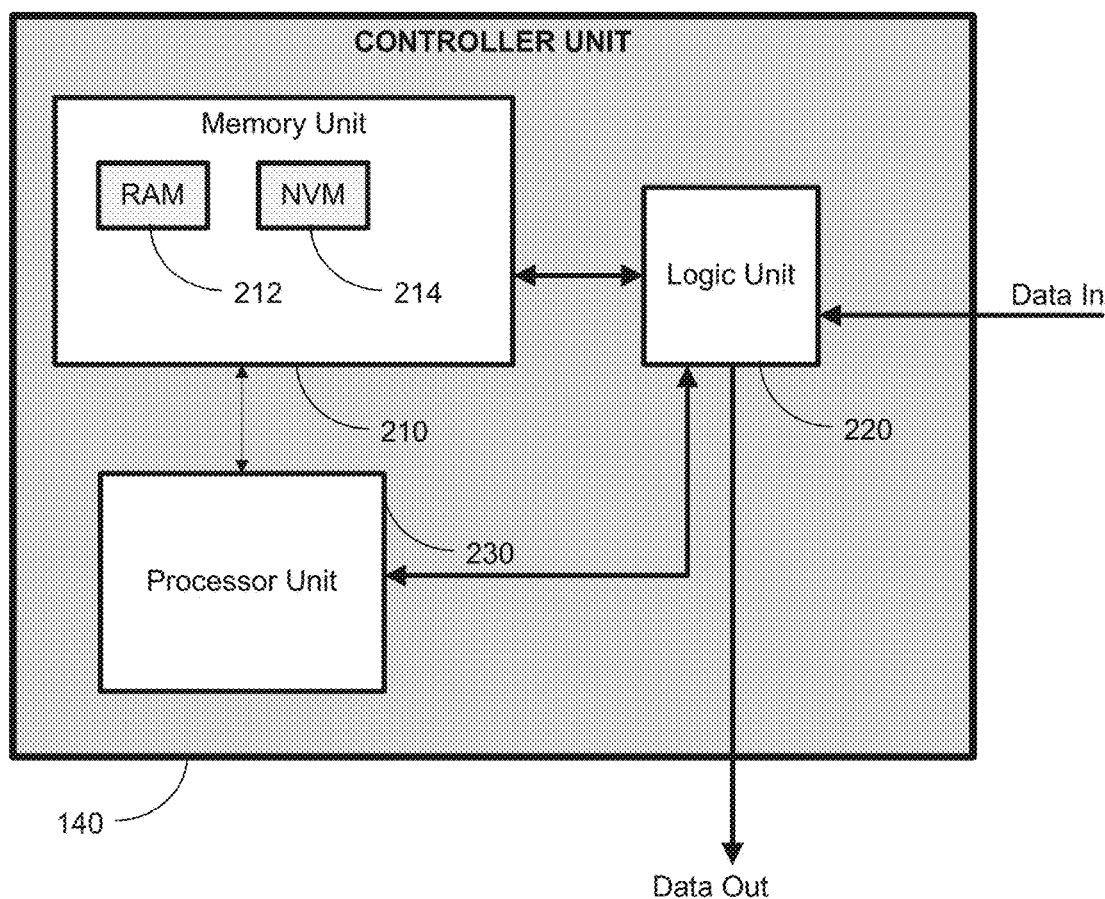
FIG. 2 illustrates a stylized block diagram description of the controller unit 140, in accordance with embodiments herein.

Turning now to FIG. 2, a stylized block diagram description of the controller unit 140, in accordance with embodiments herein, is provided. The controller unit 140 may comprise a processor unit 230 capable of controlling various function of the radar device 110. The processor unit 230 may comprise a microprocessor, a microcontroller, a field programmable gate array (FPGA), an application-specific integrated circuit (ASIC), and/or the like.

The controller unit 140 may also comprise a logic unit 220. The logic unit 220 may comprise a circuit that is capable of performing various logic operations, receiving data, and/or performing interface functions with respect to input data (data_in) and output data (data_out). The signal data_in may represent data derived from processing and analyzing the reflected signal. The data_out signal may represent data generated for performing one or more tasks as a result of the radar signal transmission and the reflected signal. For example, the data_out signal may be used to perform an action based on the radar signal transmission and reflected signal reception.

The controller unit 140 may also comprise a memory unit 210. The memory unit 210 may comprise a non-volatile memory 214 and a RAM 212. The non-volatile memory 214 may comprise FLASH memory and/or programmable read only (PROM) devices. The memory unit 210 is capable of storing operation parameters for controlling operations of the radar device 110. Further, the memory unit 210 may store the status data and the reaction data described above. The memory unit 210 may also store data that may be used to program any FPGA devices in the radar device 110. As such, the memory unit 210 may be subdivided into a program data memory, a status data memory, and a reaction data memory. This subdivision may be performed logically, or physically.

Figure 3:
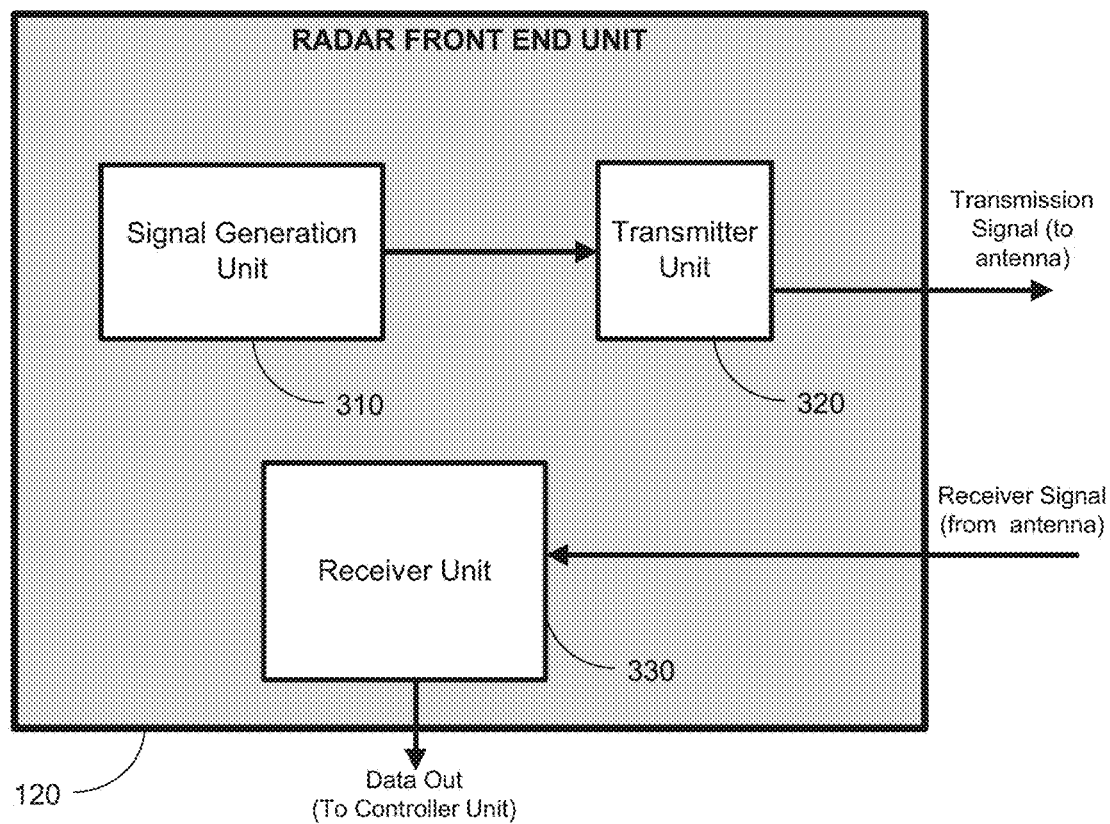
FIG. 3 illustrates a stylized block diagram depiction of the radar front end unit of FIG. 1, in accordance with embodiments herein, is illustrated.

Turning now to FIG. 3, a stylized block diagram depiction of the radar front end unit 120, in accordance with embodiments herein, is illustrated. The radar front end unit 120 may comprise a signal generation unit 310, a transmitter unit 320, and a receiver unit 330. The signal generation unit 310 is capable of generating a radar signal at a predetermined frequency. For example, a signal in the range of about 70 GHz to about 85 GHz may be generated. The signal generation unit 310 may comprise a true differential frequency doubler (FD). The FD may be formed in a push-push configuration. The signal generation unit 310 is capable of providing a radar signal for transmission. More detailed description of the signal generation unit 310 is provided below.

Continuing referring to FIG. 3, a signal for processing and transmission is provided by signal generation unit 310 to the transmitter unit 320. The transmitter unit 320 may comprise a plurality of filters, signal conditioning circuits, buffer, amplifiers, etc. for processing the signal from the signal generation unit 310. The transmission unit 320 provides a radar signal to be transmitted to the antenna unit 130.

Figure 4:
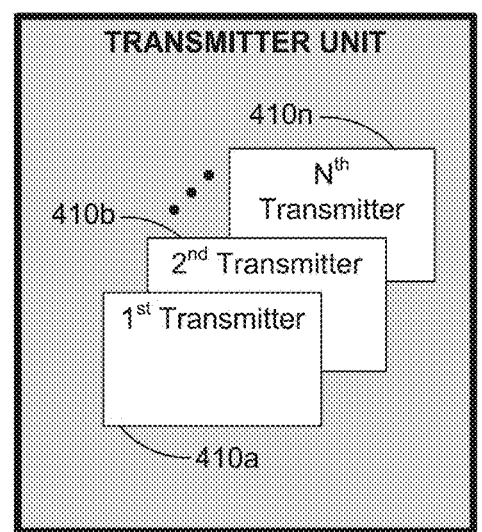
FIG. 4 illustrates a stylized block diagram of the transmitter unit of FIG. 3, in accordance with embodiments herein.

FIG. 4 illustrates a stylized block diagram of the transmitter unit 320, in accordance with embodiments herein. Referring simultaneously to FIGS. 3 and 4, the transmitter unit 320 may comprise a plurality of similar transmitters, i.e., a $1^{st}$ transmitter 410a, a $2^{nd}$ transmitter 410b, through an $N^{th}$ transmitter 410n (collectively "410"). In one embodiment, the $1^{st}$ through $N^{th}$ transmitters 410 may each process a single signal from the signal generation unit 310 and provide an output transmission signal to one or more antennas. In another embodiment, the signal generation unit 310 may provide a plurality of signals to the through $N^{th}$ transmitters 410. For example, the signal generation unit 310 may provide a signal transmit signal for each transmitter 410, or alternatively, a $1^{st}$ transmit signal for a first set of transmitters 410 and a $2^{nd}$ transmit signal for a second set of transmitters 410.

Continuing referring to FIG. 3, a received signal (i.e., reflected signal resulting from a reflection of the radar signal from a target) is provided to the receiver unit 330. The receiver unit 330 is capable of receiving the processed received signal from the signal processing unit 130. The receiver unit 330 is capable of performing analog-to-digital (A/D) conversion, signal buffering, DSP, etc. In some embodiments, the signal processing unit 130 may perform A/D conversions and DSP; however, in other embodiments, these tasks may be performed by the receiver unit 330. The receiver unit 330 is capable of directing data_out to the controller unit 140.

Figure 5:
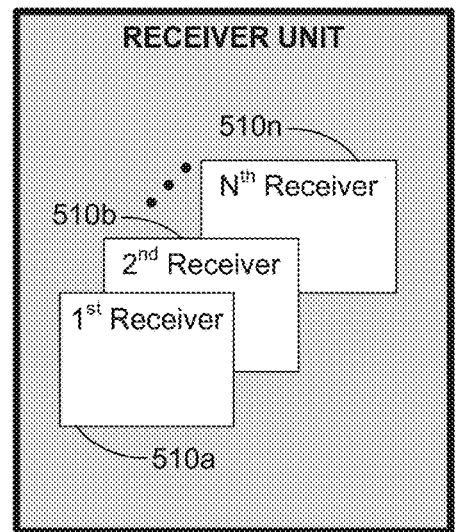
FIG. 5 illustrates a stylized block diagram of the receiver unit of FIG. 3, in accordance with embodiments herein.

FIG. 5 illustrates a stylized block diagram of the receiver unit 320, in accordance with embodiments herein. Referring simultaneously to FIGS. 3 and 5, the receiver unit 320 may comprise a plurality of similar receivers, i.e., a $1^{st}$ receiver 510a, a $2^{nd}$ receiver 510b, through an $N^{th}$ receiver 510n (collectively "510"). In one embodiment, the $1^{st}$ through $N^{th}$ receiver 510 may each process a single signal from the signal generation unit 310 and provide the signal to the controller unit 140. In another embodiment, the antenna unit 130 may provide a plurality of signals to the $1^{st}$ through $N^{th}$ receiver 510. For example, the antenna unit 130 may provide a signal to each receiver 510, or alternatively, a $1^{st}$ receiver signal for a first set of receivers 510 and a $2^{nd}$ receiver signal for a second set of receivers 510.

Figure 6:
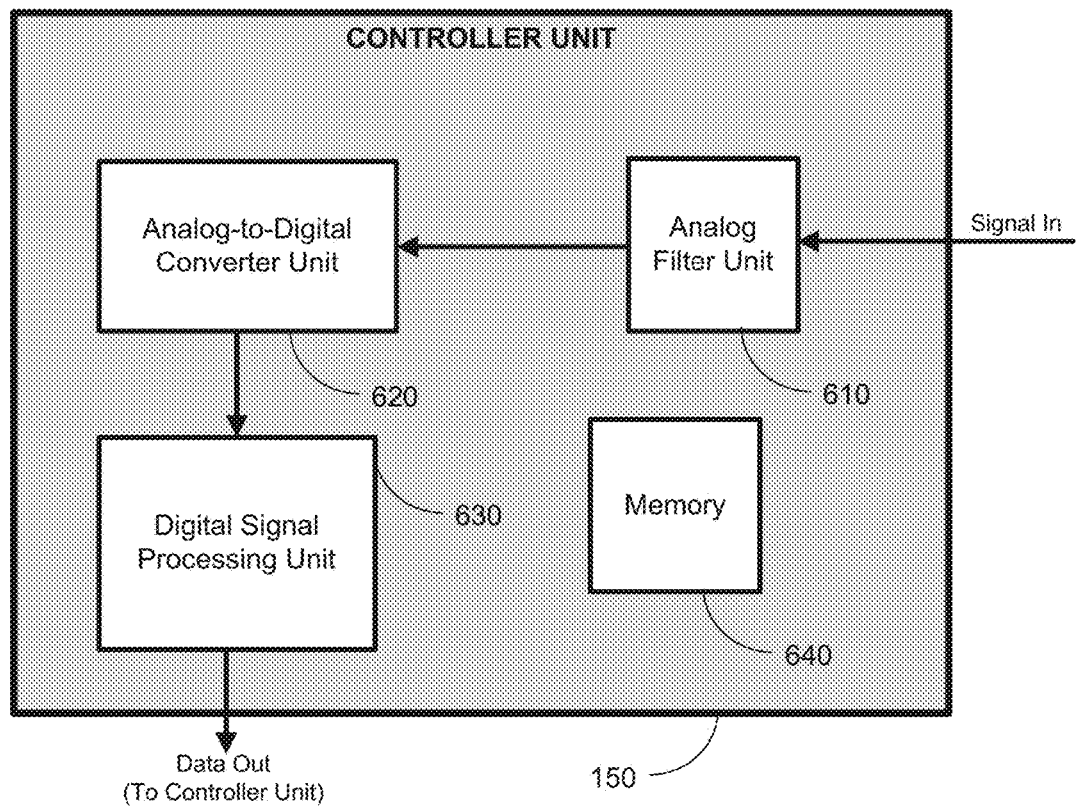
FIG. 6 illustrates a stylized block diagram depiction of the signal processing unit of FIG. 1, in accordance with embodiments herein.

Turning now to FIG. 6, a stylized block diagram depiction of the signal processing unit 150, in accordance with embodiments herein is illustrated. The signal processing unit 150 may comprise an analog filter unit 610, an A/D converter 620, a DSP unit 630, and a memory 640. The analog filter unit 610 is capable of performing filtering as well as amplification of the analog mm-wave signal received by the signal processing unit 150. Noise filtering may be performed by the analog filter unit 610 prior to performing amplification of the analog mm-wave signal.

The A/D converter 620 is capable of converting the filtered and/or amplified analog signal into a digital signal. The A/D converter 620 may be capable of performing conversions of predetermined or varying accuracy. For example, the A/D converter 620 may have an accuracy of 12-bit, 24-bit, 36-bit, 48-bit, 64-bit, 96-bit, 128-bit, 256-bit, 512-bit, 1024-bit, or greater accuracy. The converted digital mm-wave signal is provided to the DSP unit 630.

The DSP unit 630 is capable of performing a variety of DSP operations on the digital mm-wave signal. For example, digital filtering of the digital mm-wave may be performed by the DSP unit 630. As an example, signal components outside of a predetermined frequency range, e.g., 70 GHz to about 85 GHz may be filtered to be of lower amplitude. In other instances, mathematical functions, such as a Fast Fourier Transform (FFT) may be performed on the mm-wave signal. The processed digital output from the DSP unit 630 may be sent to the controller unit 140 for analysis. In other instances, the digital output may be buffered or stored into a memory 640. In some cases, the memory 640 may be a first-in-first-out (FIFO) memory. In other cases, the processed digital output from the DSP unit 630 may be stored in the memory unit 210 of the controller unit 140.

Figure 7:
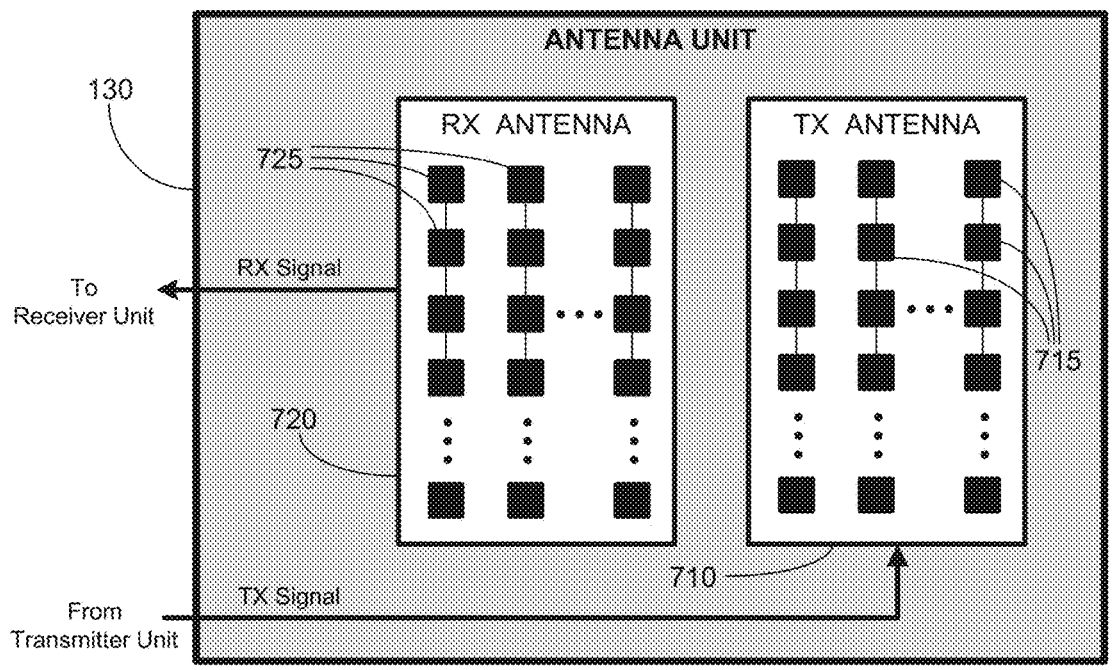
FIG. 7 illustrates a stylized block diagram depiction of the antenna unit of FIG. 1, in accordance with embodiments herein.

Turning now to FIG. 7, a stylized block diagram depiction of the antenna unit of FIG. 1, in accordance with embodiments herein, is illustrated. Millimeter-wave signals to be sent out (e.g., radar signals, network data signals, wireless communication signals, etc.) may be provided by the transmitter unit 320 (FIG. 3) to the transmit antenna 710. In one embodiment, the transmit antenna 710 may comprise a plurality of transmit antenna portions 715. The transmit antenna portions 715 are arranged in a predetermined pattern, e.g., an array matrix, as exemplified in FIG. 7.

Millimeter-wave signals that are to be received (e.g., radar signals, network data signals, wireless communication signals, etc.) may be captured by the receive antenna 720. The receive antenna 720 provides the received mm-wave signals to the receiver unit 330 (FIG. 3). In one embodiment, the receive antenna 720 may comprise a plurality of receive antenna portions 725. The receive antenna portions 725 are also arranged in a predetermined pattern, e.g., an array matrix exemplified in FIG. 7.

Figure 8:
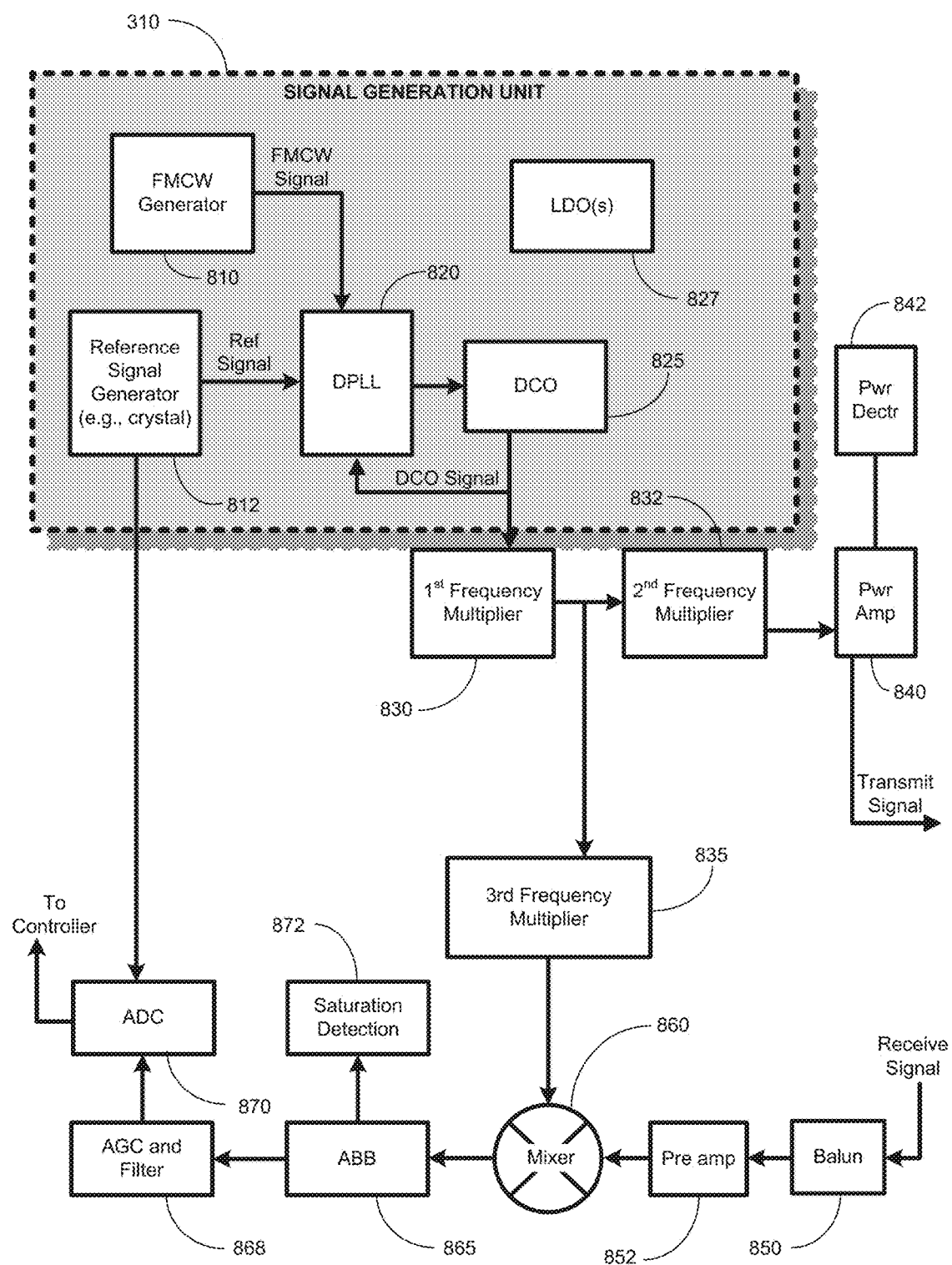
FIG. 8 illustrates a stylized block diagram depiction of an exemplary radar application of the system of FIG. 1, in accordance with embodiments herein.

Turning now to FIG. 8, a stylized block diagram depiction of an exemplary radar application of the system 100, in accordance with embodiments herein is illustrated. FIG. 8 shows an exemplary implementation of the signal generation unit 310 (FIG. 3) and exemplary portions of the transmitter unit 320 and the receiver unit 330.

The signal generation unit 310 generates a signal (e.g., a radar signal) that is to be transmitted and directed to a target region, e.g., toward the area in front of a vehicle. A frequency modulated continuous wave (FMCW) generator 810 provides an mm-wave signal in the range of about 20 GHz. The FMCW generator 810 may be configured to provide a low speed ramp (LSR) signal or a high speed ramp (HSR) signal. In alternative embodiment, the FMCW generator 810 may be replaced by a pulse train generator for application of a Pulse Doppler radar system.

Further, a reference signal is provided by a reference signal generator 812. The mm-wave signal from the FMCW generator 810 and the reference signal are both sent to a digital phase lock loop (DPLL) 820. The DPLL 820 locks the phase of the mm-wave signal from the FMCW generator 810 with the phase of the reference signal. The output of the DPLL 820 is sent to a digitally controlled oscillator (DCO) 825. The output of the DCO is fed back to the DPLL. Thus, the DCO 825 is capable of providing a stable DCO signal. The DCO signal is, in one embodiment, about 20 GHz.

A plurality of low dropout (LDO) regulators 827, which may comprise a reference voltage, an error amplifier, a feedback voltage divider, and a plurality of pass elements, e.g., transistors. The LDO regulators 827 are configured to provide a regulated voltage supply to the various portions of the circuit of FIG. 8. Generally, this regulated voltage supply is lower than the supply voltage.

In some embodiments, it is desirable to transmit an 80 GHz signal, for example in a vehicle radar application. The DCO 825 provides a 20 GHz signal, therefore, two frequency doublers may be used to multiply the 20 GHz signal to provide a 40 GHz, and then multiply the 40 GHz signal to provide an 80 GHz signal to transmit. Accordingly, a $1^{st}$ frequency multiplier 830 is used to double the 20 GHz signal to produce a 40 GHz signal. A $2^{nd}$ frequency multiplier 832 is used to double the 40 GHz signal to produce an 80 GHz signal. The output of the $2^{nd}$ frequency multiplier 832 is provided to a power amplifier 840. The output of the power amplifier 840 may be provided to the antenna for transmission. A power detector 842 may detect the power of the output of the power amplifier 840, and may prompt feedback adjustments in order to maintain a predetermined power level of the transmit signal.

A received signal may be processed by the circuit shown in FIG. 8. The received signal, e.g., from the signal processing unit 150, is provided to a balun circuit 850. The balun may comprise a transformer, and provides a differential output to a pre-amplifier 852. After performing a pre-amplification of the received signal, the output from the pre-amplifier 852 is provided to the mixer 860.

The mixer 860 is capable of combining the received signal from the pre-amplifier 852, with an output signal from a $3^{rd}$ frequency multiplier 835. The output of the $3^{rd}$ frequency multiplier 835 is the doubled version of the 40 GHz signal from the $1^{st}$ frequency multiplier. That is, the output of the $3^{rd}$ frequency multiplier 835 is an 80 GHz reference signal. The mixer 860 receives the reference 80 GHz signal and in one embodiment, multiplies it to the received signal, which is a reflected or echo signal resulting from the reflection from the transmitted signal. The output of the mixer may be used to determine various characteristics regarding an object(s) from which the transmitted signal was reflected, including direction, location, trajectory, and/or speed of the object.

Each of the $1^{st}$, $2^{nd}$, and $3^{rd}$ frequency multipliers 830, 832, 835 may be a fully differential push-push frequency doubler. The frequency doubler employed by the frequency multipliers 830, 832, 835 is described in further details below.

The output of the mixer 860 is provided to an ABB 865. The output of the ABB 865 is provided to an automatic gain control (AGC) and filter circuits 868. A saturation detection circuit 872 may detect any saturation of the signal processed by the AGC/filter circuits 868 and perform responsive adjustment. The output of the AGC/filter circuits 868 is provided to an A/D converter 870. The output of the A/D converter 870 may be provided to the controller unit 140 for further processing and responsive actions.

Figure 9:
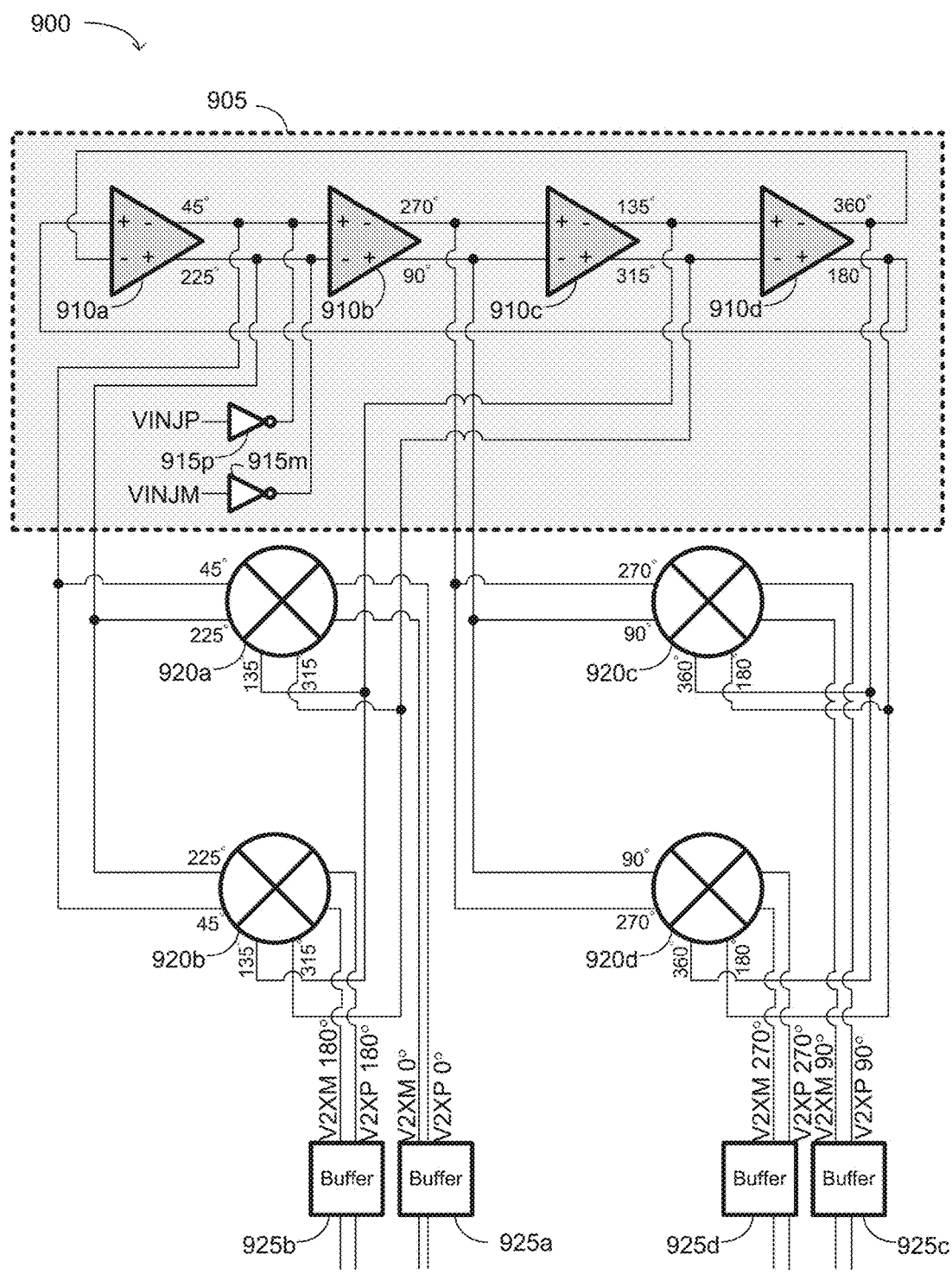
FIG. 9 illustrates a frequency doubler, in accordance with embodiments herein.

FIG. 9 depicts a frequency doubler 900, in accordance with embodiments herein. The frequency doubler 900 includes a four stage differential ring oscillator 905, a plurality of passive mixers 920, and a plurality of buffers 925.

The four stage differential ring oscillator 905 comprises four stages, 910a, 910b, 910c, and 910d. Each stage (generically, 910) receives two inputs with phases 180° apart. Herein, any pair of signals with phases 180° apart may be referred to as "P"/"+" and "M"/"−." Desirably, the signals are each square wave signals that rapidly swing from VDD to ground. Further, each stage 910 inverts each received input, shifts each received input by 135°, and provides two outputs with phases 180° apart. For example, stage 910a receives signals with phases of 180° (+) and 360° (−), inverts and shifts the inputs by 135°, and provides outputs of 45° (−) and 225° (+). Stage 910b receives signals with phases of 45° (+) and 225° (−), inverts and shifts the inputs by 135°, and provides outputs of 270° (−) and 90° (+). Stage 910c receives signals with phases of 270° (+) and 315° (−), inverts and shifts the inputs by 135°, and provides outputs of 360° (−) and 180° (+).

Of the four stages 910a-d, the outputs of a first stage are provided to two first input driver circuits of a passive mixer 920 and the outputs of a second stage are provided to two second input driver circuits of the passive mixer 920. The outputs of the first stage and the outputs of the second stage have a relative shift of 90°. For example, as shown in FIG. 9, a first stage 910a provides outputs of 45° and 225° to passive mixers 920a and 920b, and a second stage 910c provides outputs of 135° and 315° to passive mixers 920a and 920b. For another example, also as shown in FIG. 9, a first stage 910b provides outputs of 270° and 90° to passive mixers 920c and 920d, and a second stage 910d provides outputs of 360° and 180° to passive mixers 920c and 920d.

The four stage differential ring oscillator 905 further comprises two injection inputs, i.e., VINJP and VINJM, to a third stage, e.g., stage 910b. The frequency of the injected inputs drives the four stage differential ring oscillator 905 of the frequency doubler 900 will provide an output signal with a frequency twice that of VINJP and VINJM. As depicted, the injection inputs VINJP and VINJM pass through an inverter 915p or 915m, respectively, prior to being received by the third stage 910b.

Figure 10:
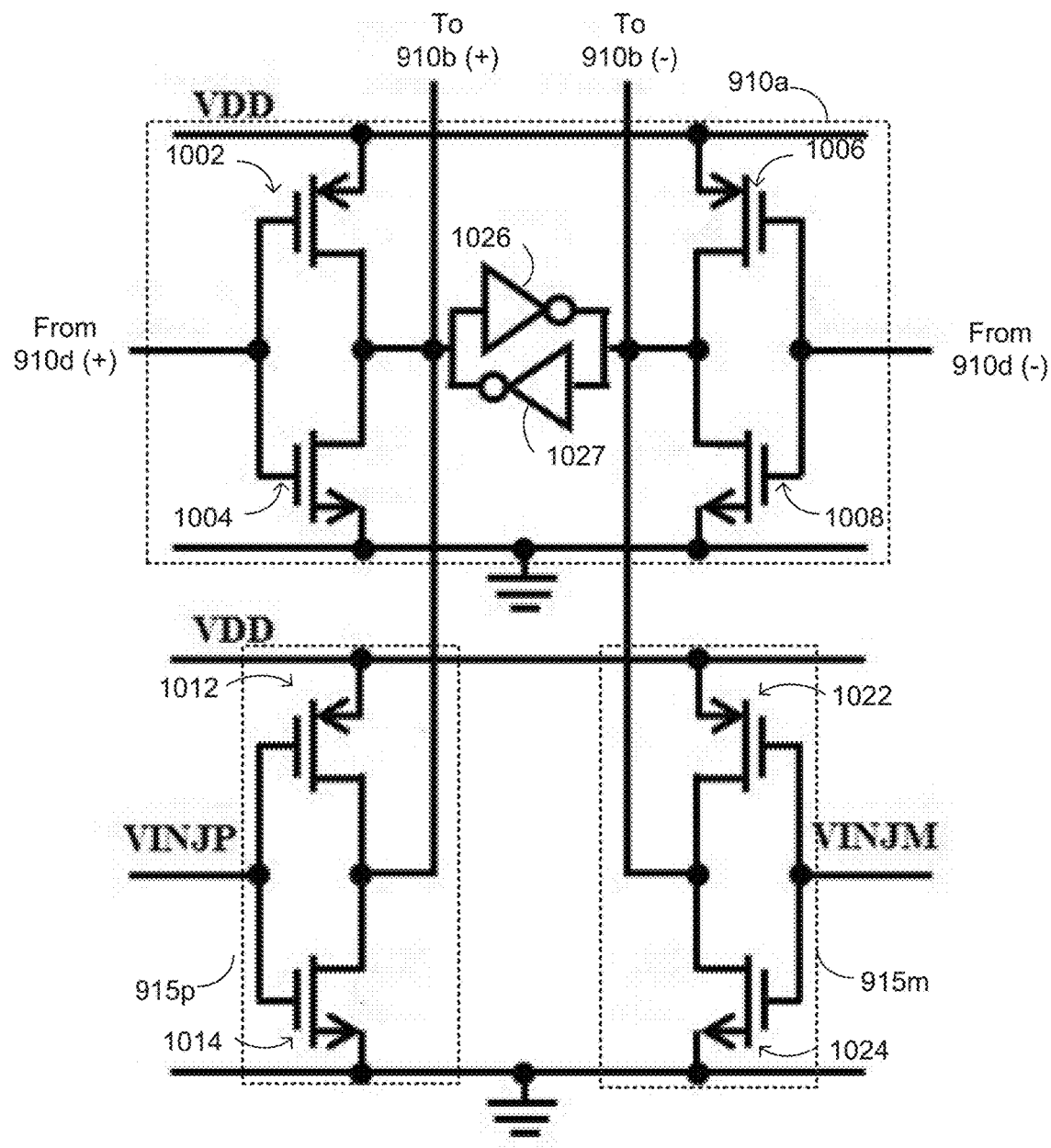
FIG. 10 illustrates a stage of a differential ring oscillator and injection inverters of the frequency doubler of FIG. 9, in accordance with embodiments herein.

FIG. 10 presents in more detail the stage 910a of the four stage differential ring oscillator 905, the VINJP inverter 915p, and the VINJM inverter 915m. Turning to the stage 910a, each input controls the gates of a pair of transistors. For example, the input received from stage 910d (+) controls the gates of a PMOS transistor 1002 and an NMOS transistor 1004. The source of the PMOS transistor 1002 is electrically connected to a local power supply VDD and the source of the NMOS transistor 1004 is electrically connected to ground. The drains of both transistors 1002 and 1004 provide the (−) output of the stage 910a to the (+) input of the stage 910b. The input received from stage 910d (−) controls the gates of a PMOS transistor 1006 and an NMOS transistor 1008. The PMOS transistor 1006 is generally similar to the PMOS transistor 1002, and the NMOS transistor 1008 is generally similar to the NMOS transistor 1004. The drains of transistors 1006 and 1008 provide the (+) output of the stage 910a to the (−) input of the stage 910b.

The stage 910a also comprises cross-coupled inverters 1026 and 1027, which are electrically connected to the drains of transistors 1002/1004 and 1006/1008.

The VINJP inverter 915p comprises a PMOS transistor 1012 and an NMOS transistor 1014. These transistors may be similar to the PMOS transistor 1002 and the NMOS transistor 1004, and need not be described in detail. The drains of transistors 1012 and 1014 are electrically connected to the (−) output of the stage 910a and the cross-coupled inverter pair 1026/1027. Similarly, the VINJM inverter 915m comprises a PMOS transistor 1022 and an NMOS transistor 1024. These transistors may be similar to the PMOS transistor 1006 and the NMOS transistor 1008. The drains of transistors 1022 and 1024 are electrically connected to the (+) output of the stage 910a and the cross-coupled inverter pair 1026/1027.

Figure 11:
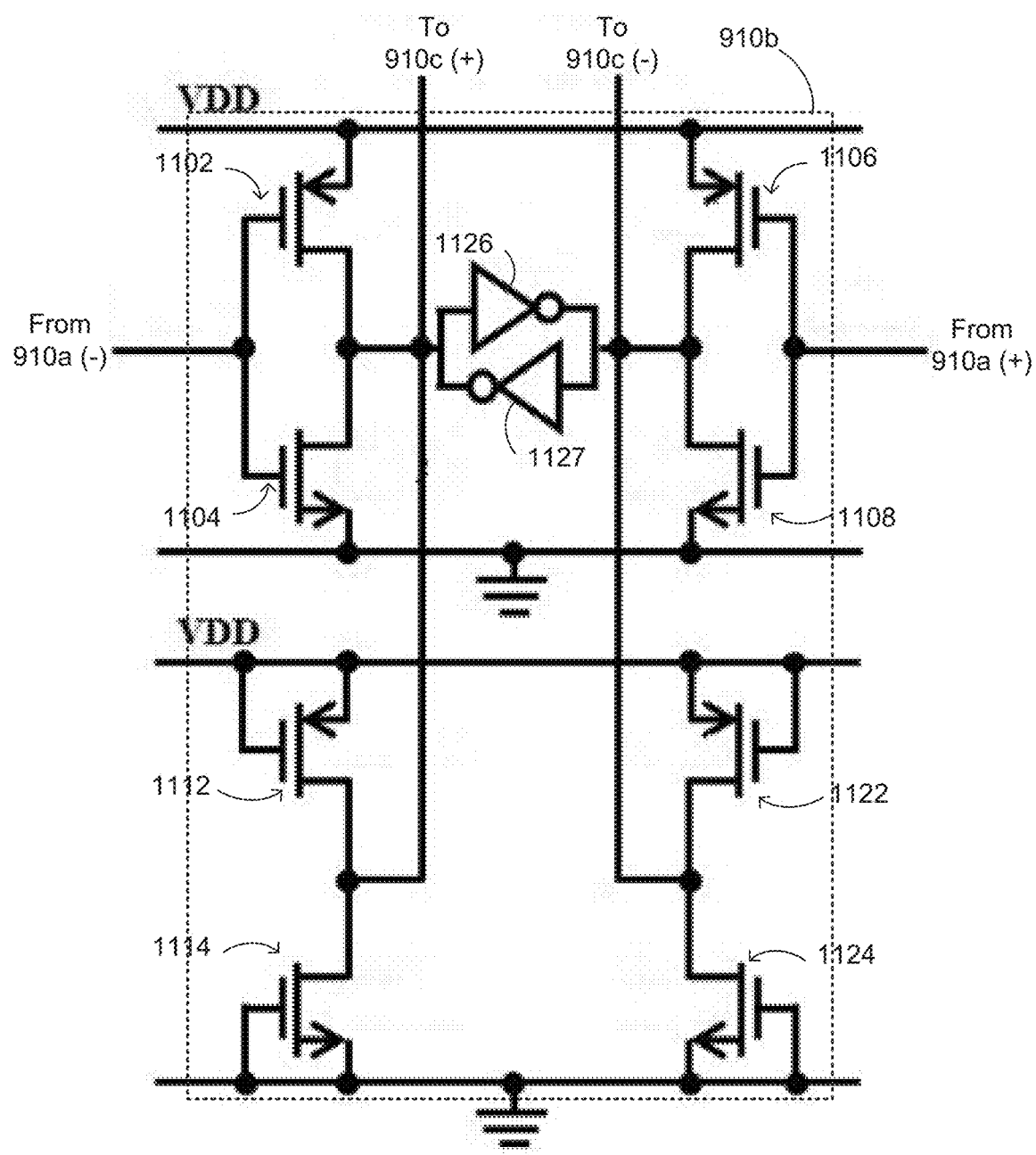
FIG. 11 illustrates another stage of a differential ring oscillator of the frequency doubler of FIG. 9, in accordance with embodiments herein.

FIG. 11 presents in more detail the stage 910b of the four stage differential ring oscillator 905. The stages 910c and 910d may be similar or identical to the stage 910b. Each input controls the gates of a pair of transistors. For example, the input received from stage 910a (−) controls the gates of a PMOS transistor 1102 and an NMOS transistor 1104. The source of the PMOS transistor 1102 is electrically connected to a local power supply VDD and the source of the NMOS transistor 1104 is electrically connected to ground. The drains of both transistors 1102 and 1104 provide the (−) output of the stage 910b to the (+) input of the stage 910c. The input received from stage 910a (+) controls the gates of a PMOS transistor 1106 and an NMOS transistor 1108. The PMOS transistor 1106 is generally similar to the PMOS transistor 1102, and the NMOS transistor 1108 is generally similar to the NMOS transistor 1104. The drains of transistors 1106 and 1108 provide the (+) output of the stage 910b to the (−) input of the stage 910c.

The stage 910b also comprises cross-coupled inverters 1126 and 1127, which are electrically connected to the drains of transistors 1102/1004 and 1106/1008.

To provide equivalent loading to each stage of the four stage differential ring oscillator 905, the stage 910b (along with stages 910c and 910d, not shown) may comprise dummy transistor pairs 1112/1114 and 1122/1124. In each dummy transistor pair, the sources of the PMOS transistors (1112 or 1122) are electrically connected to the local power supply VDD and the sources of the NMOS transistors (1114 or 1124) are electrically connected to ground. The drains are connected to the outputs of the stage 910b and the cross-coupled inverters 1126/1127, similarly to the drains of the transistors in the VINJP inverter 915p and the VINJM inverter 915m.

Returning to FIG. 9, the frequency doubler 900 also comprises at least one passive mixer 920, e.g., in the depicted embodiment, four passive mixers 920a, 920b, 920c, and 920d. Each passive mixer (referred to generically as 920) receives a first signal pair which have phases 180° apart and a second signal pair which also have phases 180° apart, wherein the two signal pairs are 90° apart. Herein, the first signal pair may be referred to as an "I" signal pair, comprising signals "IP" and "TM," and the second signal pair may be referred as a "Q" signal pair, comprising signals "QP" and "QM." Generally, the first signal pair and the second signal pair have the same frequency, which is the same frequency as the injection signal pair VINJP/VINJM. The passive mixer 920 provides an output having P and M components, wherein the frequency of the output is doubled.

In embodiments wherein the frequency doubler 900 comprises four passive mixers 920a, 920b, 920c, and 920d, the four passive mixers may each provide an output pair having phases 90° or 180° apart from the output pairs of the other three passive mixers.

Figure 12:
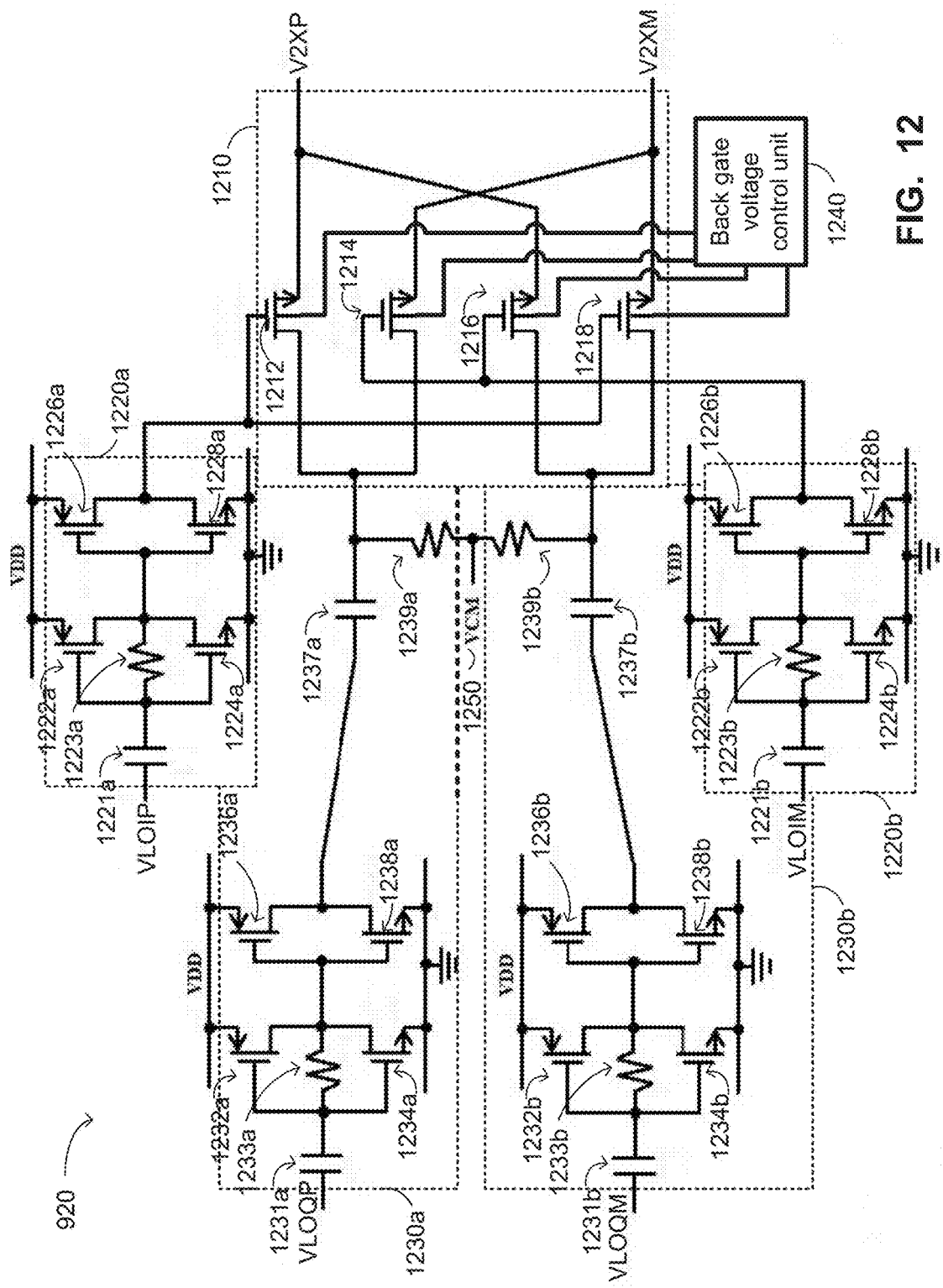
FIG. 12 illustrates a passive mixer of the frequency doubler of FIG. 9, in accordance with embodiments herein.

FIG. 12 shows a passive mixer 920 in more detail. The passive mixer 920 comprises mixing circuit 1210, at least one first input driver 1220 (e.g., two first input drivers 1220a and 1220b), two second input drivers 1230a and 1230b, back gate voltage control unit 1240, and common-mode voltage source 1250.

The mixing circuit 1210 comprises at least one transistor, e.g., four transistors. For example, as depicted in FIG. 12, the mixing circuit 1210 may comprise four NMOS transistors 1212, 1214, 1216, and 1218. In embodiments herein, the transistors 1212, 1214, 1216, and 1218 also include a back gate. The back gates may be used to affect the biasing of respective the front gates of these transistors. In one embodiment, the transistors 1212, 1214, 1216, and 1218 are formed using a fully depleted silicon-on-insulator (FDSOI) process, however, other processes that are capable of forming a transistor back gate may also be implemented in embodiments herein. At least one transistor of the mixing circuit 1210, such as all four transistors 1212, 1214, 1216, and 1218, is configured to receive a back gate voltage.

The first input driver circuits 1220a and 1220b (generically, 1220) may comprise an AC coupled capacitor 1221. The first input driver circuit 1220 also comprises a first inverter comprising a PMOS transistor 1222 and an NMOS transistor 1224, a feedback resistor 1223, and a second inverter comprising a PMOS transistor 1226 and an NMOS transistor 1228.

In the first inverter of the first input driver circuit 1220, the gates of the PMOS transistor 1222 and the NMOS transistor 1224 are controlled by the P and M signal pair outputted by stages 910a or 910b of the four stage differential ring oscillator 905 (FIG. 9). The source of the PMOS transistor 1222 is electrically connected to the local power supply VDD and the source of the NMOS transistor 1224 is electrically connected to ground. The drains of the PMOS transistor 1222 and the NMOS transistor 1224 control the gates of the PMOS transistor 1226 and the NMOS transistor 1228 of the second inverter.

In the second inverter of the first input driver circuit 1220, the source of the PMOS transistor 1226 is electrically connected to the local power supply VDD and the source of the NMOS transistor 1228 is electrically connected to ground. The drains of the PMOS transistor 1226 and the NMOS transistor 1228 of all first input driver circuits 1220 (e.g., the drains of transistors 1226a, 1228a, 1226b, and 1228b) control the gates of two transistors of the mixing circuit 1210. For example, as depicted, the drains of transistors 1226a and 1228a control the gates of transistors 1212 and 1218. For another example, as depicted, the drains of transistors 1226b and 1228b control the gates of transistors 1214 and 1216.

The passive mixer 920 also comprises two second input driver circuits 1230a, 1230b (generically, 1230). The components of the driver circuits 1230a and 1230b are respectively denoted by either an "a" or a "b" designation next to the reference numbers in FIG. 12. The second input driver circuit 1230 may comprise an AC coupled capacitor 1231 (i.e., "1231a" for circuit 1230a and "1231b" for circuit 1230b). The second input driver circuit 1230 also comprises a first inverter comprising a PMOS transistor 1232 and an NMOS transistor 1234, a feedback resistor 1233, and a second inverter comprising a PMOS transistor 1236 and an NMOS transistor 1238. The second input driver circuit 1230 may also comprise an AC coupled capacitor 1237 and a DC bias resistor 1239. The AC coupled capacitor 1237 may provide an input signal to the mixing circuit 1210, and the DC bias resistor 1239 may receive a common mode voltage from common mode voltage (VCM) source 1250.

The structures of the first inverter and the second inverter of the second input driver circuit 1230 generally resemble those of the first inverter and the second inverter of the first input driver circuit 1220, and need not be described in detail. One distinction is that the gates of the PMOS transistor 1232 and the NMOS transistor 1234 are controlled by the P and M signal pair outputted by stages 910c or 910d of the four stage differential ring oscillator 905 (FIG. 9).

Another distinction is that the drains of the PMOS transistor 1236 and the NMOS transistor of all second input driver circuits 1230 (e.g., the drains of transistors 1236a, 1238a, 1236b, and 1238b) are electrically connected to the AC coupled capacitor 1237 and the DC bias resistor 1239. Another distinction is that the drains of the PMOS transistor 1236 and the NMOS transistor of all second input driver circuits 1230 are electrically connected to the drains of two transistors of the mixing circuit 1210. For example, as depicted, the drains of transistors 1236a and 1238a are electrically connected to the drains of transistors 1212 and 1214. For another example, as depicted, the drains of transistors 1236b and 1238b are electrically connected to the drains of transistors 1216 and 1218.

Each of the transistors 1212, 1214, 1216, and 1218 may be a conventional FET, such as a MOSFET, provided the architecture of the transistors 1212, 1214, 1216, and 1218 contains a back gate. In one embodiment, the transistors 1212, 1214, 1216, and 1218 may each be formed on fully depleted silicon on insulator (FDSOI). In another embodiment, the transistors 1212, 1214, 1216, and 1218 may each be a deep n-well transistor.

In operation, the passive mixer 920 receives two input signal pairs, VLOIP/VLOIM (from the first input driver circuits 1220) and VLOQP/VLOQM (from the second input driver circuits 1230), wherein each signal pair has the same first frequency (driven by the frequency of signal pair VINJP/VINJM), and outputs a signal pair V2XP/V2XM, wherein the output signal pair has a frequency twice the first frequency.

The passive mixer 920 also comprises a back gate voltage control unit 1240 configured to provide a back gate voltage to the back gates of each transistor 1212, 1214, 1216, and 1218. The back gate voltage control unit 1240 may provide a fixed back gate voltage to each transistor, or an adjustable back gate voltage to each transistor. In one embodiment, the back gate voltage control unit 1240 provides an individually adjustable back gate voltage to each transistor 1212, 1214, 1216, and 1218.

Though not to be bound by theory, the higher the back gate voltage provided to each transistor 1212, 1214, 1216, and 1218, the lower will be that transistor's $R_{ON}$ and the higher the output voltage of the frequency doubler 900. In one embodiment, the back gate voltage provided to each transistor 1212, 1214, 1216, and 1218 may be about 3 V.

Although depicted as a single unit, the back gate voltage control unit 1240 may be implemented as a plurality of units, wherein each unit controls the back gate voltage of a single transistor of transistors 1212, 1214, 1216, and 1218.

In some embodiments, the back gate voltage control 1240 may be located proximate the mixing circuit 1210. The back gate voltage control unit 1240 may be electrically coupled to the transistors 1212, 1214, 1216, and 1218 via respective back gate voltage lines, as exemplified in FIG. 12. In other embodiments, the back gate voltage control unit 1240 may be in a separate location from the mixing circuit 1210. For example, the mixing circuit 1210 may be on a first chip, and the back gate voltage control unit 1240 may be located on a separate, second chip, electrically coupled to the transistors 1212, 1214, 1216, and 1218 via respective back gate voltage lines (as shown in FIG. 12) through input/output pins of the first and second chips (not shown).

Returning to FIG. 9, the output signals of each passive mixer 920*a-d* are provided to a corresponding buffer 925*a-d*. An exemplary buffer, generically 925, is shown in more detail in FIG. 13. The buffer 925 comprises a first pair of inverters 1310*a*, comprising PMOS transistor 1322*a* and NMOS transistor 1324*a*, and PMOS transistor 1326*a* and NMOS transistor 1328*a*. The buffer 925 also comprises a second pair of inverters 1310*b* comprising PMOS transistor 1322*b* and NMOS transistor 1324*b*, and PMOS transistor 1326*b* and NMOS transistor 1328*b*. The buffer 925 also comprises a cross-coupled pair of inverters 1336 and 1337.

Figure 13:
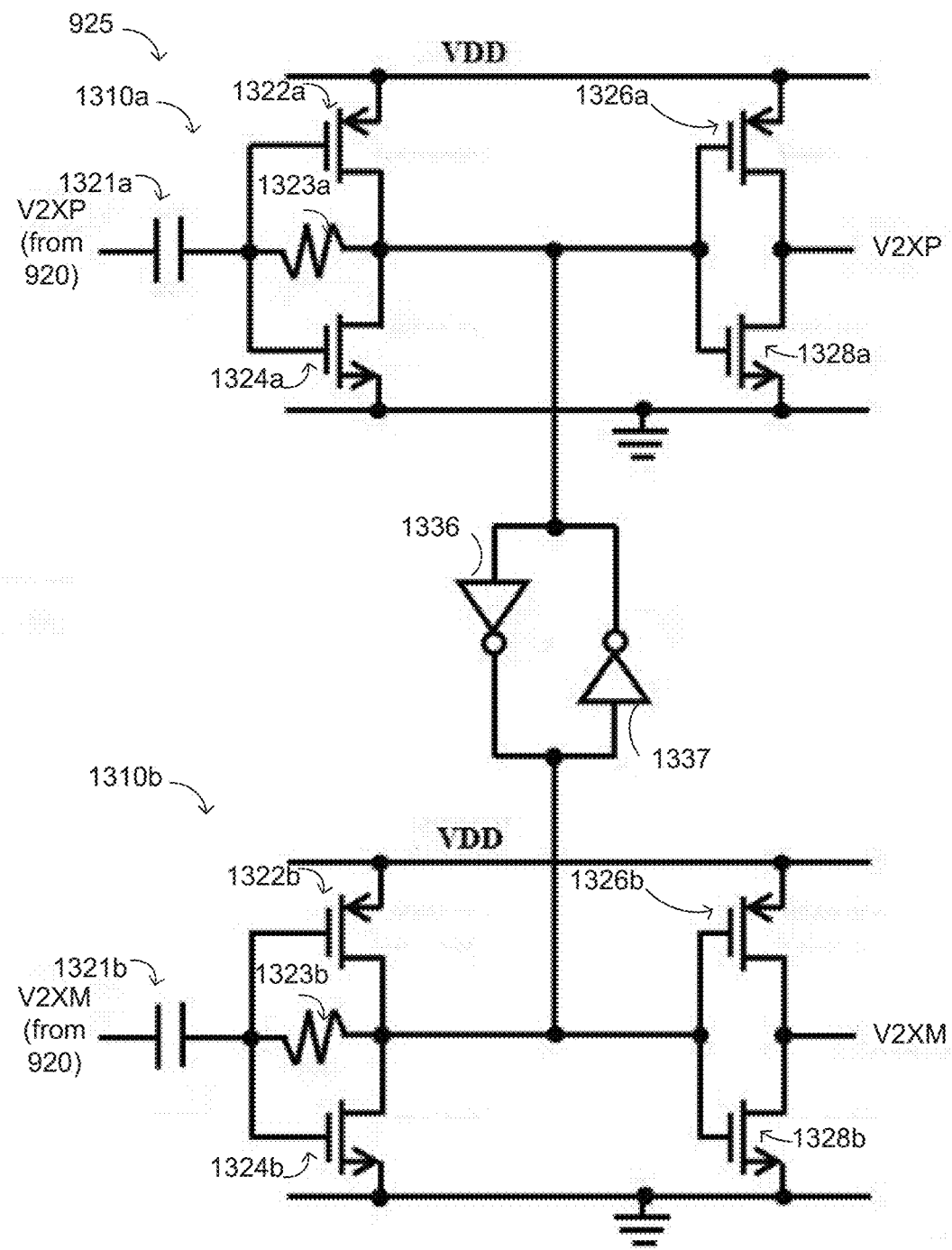
FIG. 13 illustrates a buffer of the frequency doubler of FIG. 9, in accordance with embodiments herein.

As depicted in FIG. 13, one component of the signal output by a passive mixer 925 passes through AC coupled capacitor 1321 and controls the gates of the PMOS transistor 1322 and the NMOS transistor 1324 of a pair of inverters 1310. The source of the PMOS transistor 1322 is electrically connected to the local power supply VDD and the source of the NMOS transistor 1324 is electrically connected to ground. The drains of the PMOS transistor 1322 and the NMOS transistor 1324 control the gates of the PMOS transistor 1326 and the NMOS transistor 1328 of another inverter of the inverter pair 1310.

In the other inverter of the pair 1310, the source of the PMOS transistor 1326 is electrically connected to the local power supply VDD and the source of the NMOS transistor 1328 is electrically connected to ground. The drains of the PMOS transistor 1326 and the NMOS transistor 1328 provide one component of the output signal of buffer 925. The output signal may be provided to any other component of a device, such as an mm-wave device or component thereof depicted in any of FIGS. 1-8.

Each inverter pair 1310 may also comprise a feedback resistor 1323, such as is depicted in FIG. 13.

The buffer 925 may also comprise a cross-coupled inverter pair 1336/1337, electrically connected to the drains of transistors 1322/1324 and the gates of transistors 1326/1328. The cross-coupled inverter pair 1336/1337 may reduce undesirable harmonics generated by the passive mixer 920, such as harmonics having frequencies that are 1, 3, 4, or 5 times the frequency of VINJP/VINJM.

Similarly to the transistors 1212, 1214, 1216, and 1218, any other transistor depicted in FIGS. 10-13 may be a conventional FET, such as a MOSFET. In one embodiment, any transistor within frequency doubler 900 may be formed on FDSOI. In another embodiment, any transistor within frequency doubler 900 may be a deep n-well transistor.

Figure 14:
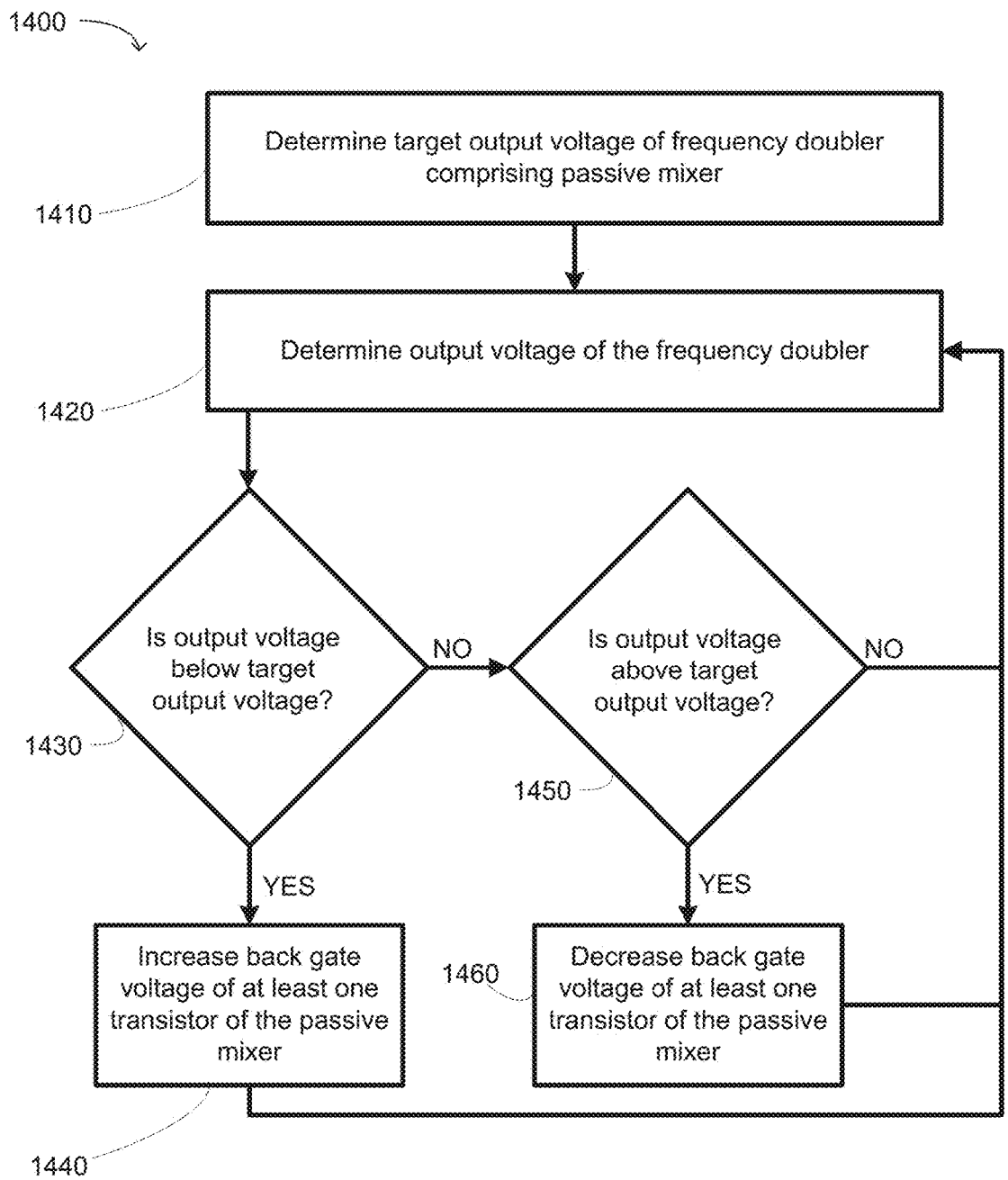
FIG. 14 illustrates a method, in accordance with embodiments herein.

FIG. 14 provides a flowchart of a method 1400, in accordance with embodiments herein. As depicted, the method 1400 comprises determining (at 1410) a target output voltage of a frequency doubler comprising at least one passive mixer comprising at least one transistor configured to receive a back gate voltage.

The target output voltage of the frequency doubler may be determined as a routine matter, based on the intended use of a device comprising the frequency doubler, the architectures of components of the frequency doubler, and/or other parameters that will be apparent to the person of ordinary skill in the art. Generally, it is desirable to have the highest possible target output voltage consistent with power consumption requirements of the frequency doubler.

In one embodiment, the at least one passive mixer further comprises at least one of at least one first input driver circuit comprising a first inverter and a second inverter; and two second input driver circuits each comprising a first inverter and a second inverter.

In one embodiment, the passive mixer may comprise four transistors, two first input driver circuits, and two second input driver circuits. Alternatively or in addition, the frequency doubler may comprise four passive mixers.

In one embodiment, the at least one transistor is formed on fully depleted silicon on insulator (FDSOI).

The method 1400 also comprises determining (at 1410) an output voltage of the frequency doubler. The output voltage of the frequency doubler may vary based on processing variations when forming components of the frequency doubler. The output voltage of the frequency doubler may also vary based on the ambient temperature at which the frequency doubler is used. The effect of temperature may be especially relevant when a device comprising the frequency doubler is used in an outdoor application. One such application is automotive radars, which must be rated to function at temperatures from −40° C. to +140° C.

The output voltage may then be compared to the target output voltage, and the back gate voltage of the at least one transistor may be adjusted. As depicted in FIG. 14, the comparison and adjustment may be implemented by determining (at 1430) if the output voltage is below the target output voltage. If the output voltage is below the target output voltage, flow proceeds to increasing (at 1440) the back gate voltage of the at least one transistor. By doing so, the output voltage may be increased. Though not to be bound by theory, by increasing (at 1440) the back gate voltage of the at least one transistor, the $R_{ON}$ of the transistor may be reduced, thereby increasing the output voltage.

On the other hand, if the output voltage is not below the target output voltage, flow proceeds to determining (at 1450) whether the output voltage is above the target output voltage. If the output voltage is above the target output voltage, flow proceeds to decreasing (at 1460) the back gate voltage of the at least one transistor. By doing so, the output voltage may be decreased. Though not to be bound by theory, by decreasing (at 1460) the back gate voltage of the at least one transistor, the $R_{ON}$ of the transistor may be increased, thereby reducing the output voltage.

If the output voltage is neither below nor above the target output voltage, flow returns to determining (at 1420).

Alternatively or in addition, the method may involve adjusting the back gate voltage upon a detection of an amplitude imbalance between the output components of the frequency doubler 900.

Figure 15:
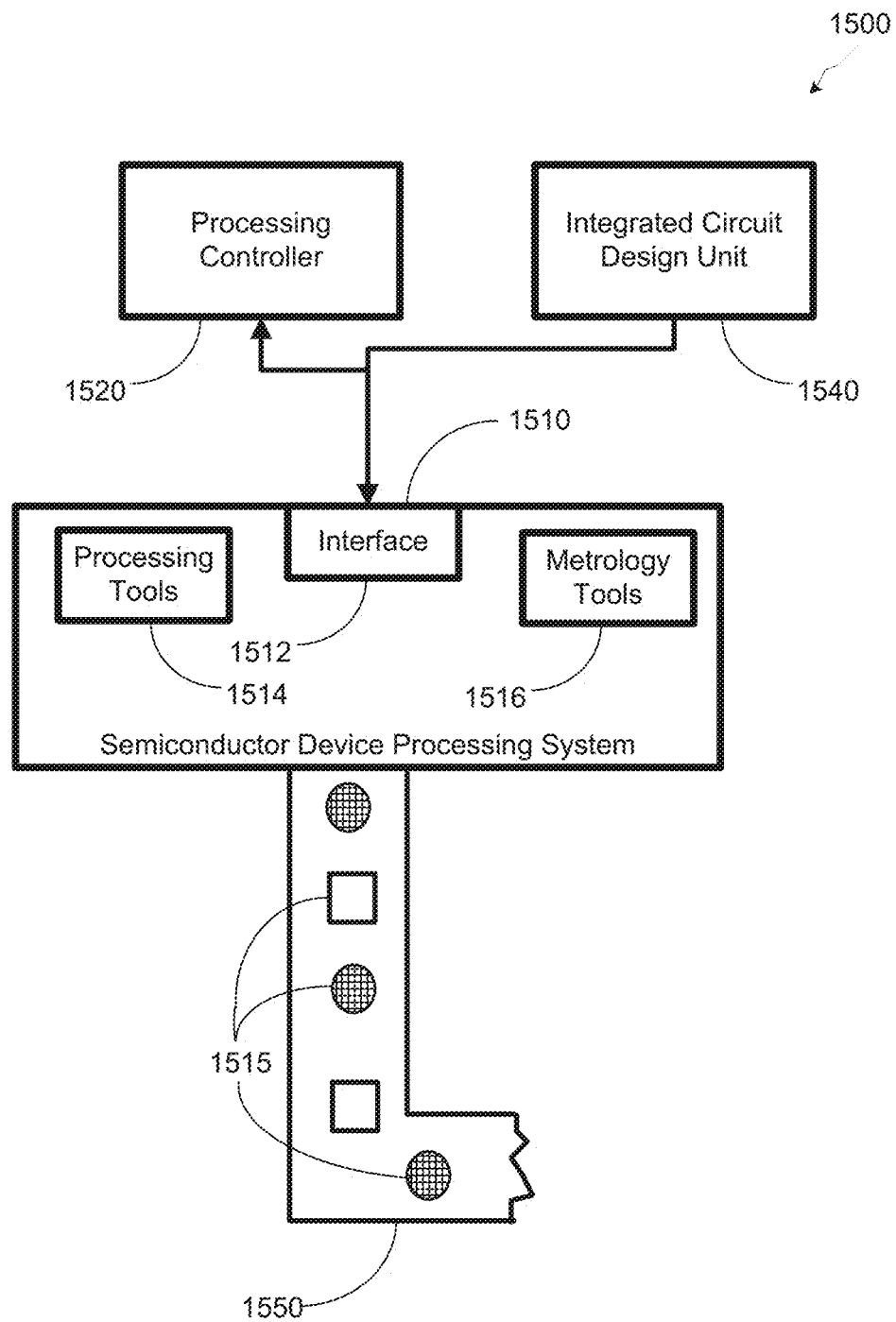
FIG. 15 illustrates a stylized depiction of a system for fabricating a semiconductor device, in accordance with embodiments herein.

Turning now to FIG. 15, a stylized depiction of a system 1500 for fabricating a semiconductor device package comprising a power amplifier circuit, in accordance with embodiments herein, is illustrated. A system 1500 of FIG. 15 may comprise a semiconductor device processing system 1510 and an integrated circuit design unit 1540. The semiconductor device processing system 1510 may manufacture integrated circuit devices based upon one or more designs provided by the integrated circuit design unit 1540.

The semiconductor device processing system 1510 may comprise various processing stations, such as etch process stations, photolithography process stations, CMP process stations, etc. Each of the processing stations may comprise one or more processing tools 1514 and or metrology tools 1516. Feedback based on data from the metrology tools 1516 may be used to modify one or more process parameters used by the processing tools 1514 for performing process steps.

The semiconductor device processing system 1510 may also comprise an interface 1512 that is capable of providing communications between the processing tools 1514, the metrology tools 1516, and a controller, such as the processing controller 1520. One or more of the processing steps performed by the semiconductor device processing system 1510 may be controlled by the processing controller 1520. The processing controller 1520 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1510 may produce integrated circuits on a medium, such as silicon wafers. More particularly, the semiconductor device processing system 1510 may produce integrated circuits comprising a frequency doubler, such as the frequency doubler 900 depicted in FIG. 9.

The production of integrated circuits by the semiconductor device processing system 1510 may be based upon the circuit designs provided by the integrated circuit design unit 1540. The semiconductor device processing system 1510 may provide processed integrated circuits/devices 1515 on a transport mechanism 1550, such as a conveyor system. In some embodiments, the conveyor system may be sophisticated clean room transport systems that are capable of transporting semiconductor wafers. In one embodiment, the semiconductor device processing system 1510 may implement a plurality of processing steps.

In some embodiments, the items labeled "1515" may represent individual wafers, and in other embodiments, the items 1515 may represent a group of semiconductor wafers, e.g., a "lot" of semiconductor wafers. The integrated circuit or device 1515 may comprise a transistor, a capacitor, a resistor, a memory cell, a processor, and/or the like.

The integrated circuit design unit 1540 of the system 1500 is capable of providing a circuit design that may be manufactured by the semiconductor device processing system 1510. This may include information regarding the number of passive mixers, the default capacitance of any capacitors, the default resistance of any resistors; etc.

The integrated circuit design unit 1540 may be capable of determining the number of devices (e.g., processors, memory devices, etc.) to place in a device package. Based upon such details of the devices, the integrated circuit design unit 1540 may determine specifications of the devices that are to be manufactured. Based upon these specifications, the integrated circuit design unit 1540 may provide data for manufacturing a semiconductor device package described herein.

The system 1500 may be capable of performing analysis and manufacturing of various products involving various technologies. For example, the system 1500 may receive design and production data for manufacturing devices of CMOS technology, Flash technology, BiCMOS technology, power devices, memory devices (e.g., DRAM devices), NAND memory devices, and/or various other semiconductor technologies. This data may be used by the system 1500 to fabricate semiconductor devices described herein.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus, comprising:
a frequency doubler having an output voltage and comprising:
at least one passive mixer comprising:
at least one transistor configured to receive a back gate voltage, wherein the output voltage of the frequency doubler is based at least in part on the back gate voltage;
at least one first input driver circuit comprising a first inverter and a second inverter; and
two second input driver circuits each comprising a first inverter and a second inverter.

2. The apparatus of claim 1, wherein the passive mixer comprises four transistors configured to receive the back gate voltage, two first input driver circuits, and the two second input driver circuits.

3. The apparatus of claim 2, further comprising a four stage differential ring oscillator, wherein each stage receives two inputs and provides two outputs, each stage shifts each received input by 135°, the outputs of each stage with phases 180° apart, the outputs of a first stage are provided to the two first input driver circuits, and the outputs of a second stage are provided to the two second input driver circuits, wherein the outputs of the first stage and the outputs of the second stage have a relative shift of 90°.

4. The apparatus of claim 3, wherein the four stage differential ring oscillator further comprises two injection inputs to a third stage.

5. The apparatus of claim 4, wherein each injection input passes through an inverter prior to being received by the third stage.

6. The apparatus of claim 5, comprising four passive mixers, wherein each passive mixer provides a differential output having a phase shift of 90° or 180° relative to the other three passive mixers.

7. The apparatus of claim 1, further comprising a buffer configured to receive a differential output of the passive mixer, wherein the buffer comprises a first pair of inverters, a second pair of inverters, and a cross-coupled pair of inverters.

8. The apparatus of claim 1, wherein the at least one transistor, the first inverter and the second inverter of the at least one first input driver circuit; and the first inverter and the second inverter of the two second input driver circuits are formed on fully depleted silicon on insulator (FDSOI).

9. A method, comprising:
determining a target output voltage of a frequency doubler comprising at least one passive mixer comprising at least one transistor configured to receive a back gate voltage;

determining an output voltage of the frequency doubler, wherein the output voltage of the frequency doubler is based at least in part on the back gate voltage of the at least one transistor;

increasing a back gate voltage of the at least one transistor, in response to determining that the output voltage is below the target output voltage; and decreasing the back gate voltage of the at least one transistor, in response to determining that the output voltage is above the target output voltage.

10. The method of claim 9, wherein the at least one passive mixer further comprises at least one of at least one first input driver circuit comprising an AC coupled capacitor, a first inverter, a feedback resistor, and a second inverter; and two second input driver circuits each comprising an AC coupled capacitor, a first inverter, a first feedback resistor, a second inverter, and a DC bias resistor, wherein the DC bias resistors of both second input driver circuits receive a common mode voltage.

11. The method of claim 10, wherein the passive mixer comprises four transistors, two first input driver circuits, and two second input driver circuits.

12. The method of claim 9, wherein the frequency doubler comprises four passive mixers.

13. The method of claim 9, wherein the at least one transistor is formed on fully depleted silicon on insulator (FDSOI).

14. A system, comprising:
a semiconductor device processing system to manufacture a semiconductor device; and
a processing controller operatively coupled to said semiconductor device processing system, said processing controller configured to control an operation of the semiconductor device processing system;
wherein the semiconductor device processing system is adapted to:
form a frequency doubler, comprising
forming at least one passive mixer comprising at least one of the following:
at least one transistor configured to receive a back gate voltage;
at least one first input driver circuit comprising a first inverter and a second inverter; and
two second input driver circuits each comprising a first inverter and a second inverter.

15. The system of claim 14, wherein the semiconductor device processing system is adapted to form four transistors, two first input driver circuits, and the two second input driver circuits.

16. The system of claim 15, wherein the semiconductor device processing system is further adapted to form a four stage differential ring oscillator, wherein each stage receives two inputs and provides two outputs, each stage shifts each received input by 135°, the outputs of each stage with phases 180° apart, the outputs of a first stage are provided to the two first input driver circuits, and the outputs of a second stage are provided to the two second input driver circuits, wherein the outputs of the first stage and the outputs of the second stage have a relative shift of 90°.

17. The system of claim 16, wherein the semiconductor device processing system is further adapted to form two injection inputs to a third stage of the four stage differential ring oscillator and two inverters, wherein each injection input is configured to pass through one inverter prior to being received by the third stage.

18. The system of claim 17, wherein the semiconductor device processing system is adapted to form four passive mixers, wherein each passive mixer provides a differential output having a phase shift of 90° or 180° relative to the other three passive mixers.

19. The system of claim 14, wherein the semiconductor device processing system is adapted to form a buffer configured to receive a differential output of the passive mixer, wherein the buffer comprises a first pair of inverters, a second pair of inverters, and a cross-coupled pair of inverters.

20. The system of claim 14, wherein the semiconductor device processing system is further adapted to form the at least one transistor, the first inverter and the second inverter of the at least one first input driver circuit; and the first inverter and the second inverter of the two second input driver circuits on fully depleted silicon on insulator (FDSOI).

* * * * *